United States Patent [19]

Ristic et al.

[11] Patent Number: 5,545,912
[45] Date of Patent: Aug. 13, 1996

[54] ELECTRONIC DEVICE ENCLOSURE INCLUDING A CONDUCTIVE CAP AND SUBSTRATE

[75] Inventors: Ljubisa Ristic, Paradise Valley; Daniel N. Koury, Mesa; John E. Schmiesing, Tempe; Ronald J. Gutteridge, Paradise Valley; Henry G. Hughes, Scottsdale, all of Ariz.

[73] Assignee: Motorola, Inc., Schaumburg, Ill.

[21] Appl. No.: 329,927

[22] Filed: Oct. 27, 1994

[51] Int. Cl.⁶ .......................... G01P 15/125; H01L 23/14
[52] U.S. Cl. ...................... 257/417; 73/514.36; 257/420; 257/659
[58] Field of Search ...................................... 257/414–418, 257/659–660, 532, 784, 786, 420; 73/517 R, 517 AV, 517 A; 361/283

[56] References Cited

U.S. PATENT DOCUMENTS

| | | | |
|---|---|---|---|
| 5,089,876 | 2/1992 | Ishioka | 257/659 |
| 5,115,291 | 5/1992 | Stokes | 73/517 AV |
| 5,146,389 | 9/1992 | Ristic et al. | 73/517 AV |
| 5,216,490 | 6/1993 | Greiff et al. | 73/517 R |
| 5,381,300 | 1/1995 | Thomas et al. | 73/517 R |

OTHER PUBLICATIONS

Ristic et al., "A Capacitive Type Accelerometer with Self-Test Feature Based on a Double–Pinned Polysilicon Structure" 7th International Conference on Solid–State Sensors and Actuators, Transducers 1993, Yokohama, Japan, Jun. 7–10, 1993, Digest of Technical Papers, pp. 810–813.

Primary Examiner—Peter Toby Brown
Attorney, Agent, or Firm—Bruce T. Neel

[57] ABSTRACT

An enclosure (8) for an electronic device (26) such as, for example, an accelerometer. The enclosure (8) includes a conductive semiconductor substrate (12) underlying the electronic device (26), a conductive cap (16) overlying the electronic device (26), and a power supply (25) having one or more outputs (27, 29) each with a substantially fixed potential wherein one output is electrically coupled to the conductive semiconductor substrate (12) and another output to the conductive cap (16). In a preferred embodiment, substrate (12) and cap (16) are coupled to the same power supply output (27). This coupling substantially eliminates the adverse effects of parasitic capacitances of the substrate (12) and cap (16) to reduce measurement error and EMI when a capacitive accelerometer is used as the electronic device (26).

16 Claims, 2 Drawing Sheets

5,545,912

ELECTRONIC DEVICE ENCLOSURE INCLUDING A CONDUCTIVE CAP AND SUBSTRATE

BACKGROUND OF THE INVENTION

The present invention relates, in general, to electronic devices and, more particularly, to a conductive enclosure for an electronic device.

Micro-electronic devices are typically placed in an enclosure to protect them from adverse environmental elements. One specific type of electronic device that is placed in an enclosure during manufacture is a capacitive sense accelerometer. One such prior accelerometer uses a sensing element formed from three parallel polysilicon layers that are formed overlying a supporting substrate. The accelerometer is enclosed and hermetically-sealed from the environment by an overlying cap. The middle polysilicon layer provides a middle plate that acts as a seismic mass and that is free to move in response to acceleration. In the absence of external forces, the middle plate is centered between the other two polysilicon plates resulting in equal top and bottom capacitance values. In the presence of an external acceleration, the middle plate moves, resulting in a differential capacitance change, from which the driving acceleration can be determined. Such a sense accelerometer is described by Ristic et al. in "A Capacitive Type Accelerometer with Self-Test Feature Based on a Double-Pinned Polysilicon Structure" 7th International Conference on Solid-State Sensors and Actuators: Transducers 1993, Yokohama, Japan, Jun. 7–10, 1993, Digest of Technical Papers, pp. 810–813, which is hereby incorporated by reference in full.

A previously unrecognized problem that has been found with the prior accelerometer discussed above is that its output sensitivity is reduced due to parasitic capacitances from the top and bottom capacitors of the sensing element to the enclosing cap and underlying substrate. The presence of these parasitic capacitances has been found in some cases to reduce the accelerometer's sensitivity by about fifty percent. Accordingly, there is a need for an accelerometer enclosure that reduces the adverse effects of the parasitic capacitances of the supporting substrate and enclosing cap.

DETAILED DESCRIPTION OF THE DRAWINGS

Briefly stated, the present invention provides an enclosure for an electronic device. The enclosure includes a conductive semiconductor substrate underlying the electronic device, a conductive cap overlying the electronic device, a first power supply output having a substantially fixed potential wherein the first power supply output is electrically coupled to the conductive semiconductor substrate, and a second power supply output having a substantially fixed potential wherein the second power supply output is coupled to the conductive cap. In a preferred embodiment, the first power supply output is coupled to both the substrate and cap. Coupling the power supply outputs to the substrate and cap substantially eliminates the adverse effects of parasitic capacitances between the electronic device and the substrate and cap. A resulting advantage is reduced measurement error when, for example, a capacitive accelerometer is used as the electronic device. Also, coupling in this manner provides an effective electromagnetic interference (EMI) shield for the electronic device.

Figure 1:
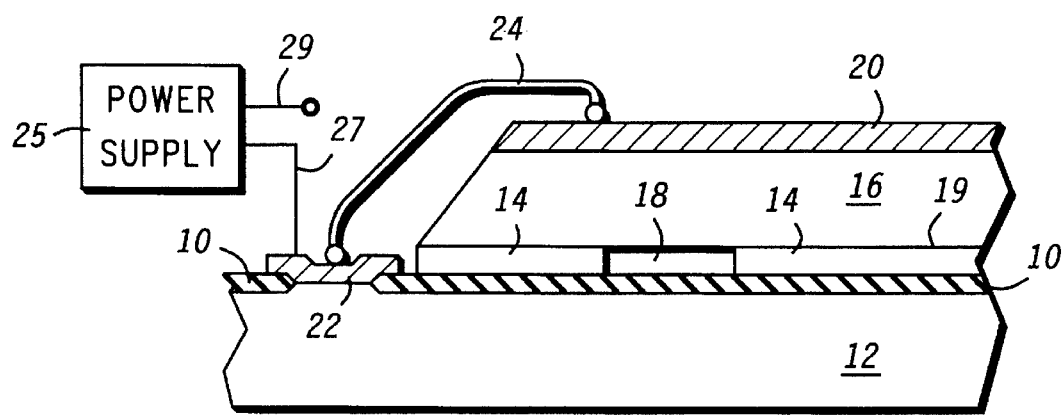
FIG. 1 illustrates a partial cross-section of an enclosure for an electronic device according to the present invention.

The present invention can be more fully described with reference to FIGS. 1–3. FIG. 1 illustrates a cross-section of an enclosure 8 for an electronic device 26 (shown in FIG. 2). A dielectric layer 10 is disposed on a conductive semiconductor substrate 12, and a bonding layer 14 is disposed on dielectric layer 10. A cavity 18 in bonding layer 14 is provided to accommodate electronic device 26. A conductive cap 16 overlies cavity 18 and is disposed on bonding layer 14. Bonding layer 14 surrounds cavity 18 so that electronic device 26 is hermetically sealed in cavity 18, and bonding layer 14 preferably has a thickness of, for example, less than about 50 microns. In a preferred embodiment, cap 16 is formed of a semiconductor material similar to that used for substrate 12.

In order to form enclosure 8, bonding layer 14 is, for example, a frit glass that is patterned on a surface of cap 16 by screen printing so as to later provide cavity 18. The frit glass, which is also known in the art as a powder glass, is a mixture of glass particles dispersed in an organic binder or solvent. After screen printing, the frit glass is heated to evaporate the organic binder or solvent, and while heated, the frit glass is placed in contact with substrate 12. The frit glass then enamels or flows to bond cap 16 to substrate 12 and simultaneously provide cavity 18.

In forming enclosure 8 above, it should be appreciated that cavity 18 is not necessary in all cases. For example, where electronic device 26 does not have moving mechanical parts, bonding layer 14 can fully surround and contact the elements of electronic device 26 without adverse effect, and thus, cavity 18 is not needed.

According to the present invention, substrate 12 and cap 16 are coupled to a power supply 25 that provides a first output 27 having a substantially fixed potential and a second output 29 also having a substantially fixed potential, which may be of the same or a different magnitude as that of first output 27. In the preferred embodiment substrate 12 and cap 16 are both electrically connected to first output 27, as discussed below.

Referring to FIG. 1, in the preferred embodiment first output 27 is connected to a bonding pad 22, which is preferably a metal. An electrical conductor 24 connects bonding pad 22 to a metal layer 20 that is formed on cap 16, for example, by sputtering. Metal layer 20 is provided to facilitate electrical connection to cap 16 by conductor 24, and electrical conductor 24 may be a wire bond, as is known. First output 27 of power supply 25 is connected to bonding pad 22 by conventional means, such as with a wire bond. For example, a wire bond can be stitched from a bond pad of a separate, but proximate, integrated circuit (not shown) containing power supply 25 to bonding pad 22, and then further stitched to metal layer 20 without breaking the stitch. Following these connections, first output 27 of power supply 25 is electrically connected to both substrate 12 and to cap 16. Optional second output 29 is shown in FIG. 1 as floating in order to correspond to this preferred embodiment.

Alternatively, substrate 12 may be connected to first output 27 by using bonding pad 22, and cap 16 may be connected to second output 29 by a second electrical conductor (not shown) that does not contact bonding pad 22. Further, second output 29 may be alternatively provided by a second power supply (not shown).

The impedance of power supply 25 is made sufficiently low so that first and second outputs 27 and 29 are able to substantially shunt parasitic transient currents that capacitively couple to substrate 12 and cap 16 from electronic device 26 (shown in FIG. 2), as is explained in greater detail below. One example of a suitable low impedance power supply is a bandgap regulator power supply, as is known.

As mentioned above, power supply 25 may be provided on a separate integrated circuit (not shown) in close proximity to substrate 12. This separate integrated circuit and substrate 12 are typically placed on a common leadframe and then molded in a plastic package using conventional methods. Alternatively, power supply 25 may be provided on substrate 12.

Semiconductor substrate 12 and cap 16 are both conductive so that an adequate electrical connection to power supply 25 is established substantially throughout the extent of substrate 12 and cap 16. In a preferred embodiment, both substrate 12 and cap 16 are n-type silicon each having a dopant concentration of preferably greater than about $10^{18}$ atoms/cm$^3$. However, in other embodiments cap 16 may be formed of other materials such as conductive polymers or metal alloys (such as, for example, an alloy sold under the trademark Kovar). It is preferable that these other materials have a thermal expansion coefficient similar to that of silicon.

Dielectric layer 10 insulates electronic device 26 (shown in FIG. 2) from substrate 12. For example, dielectric layer 10 is a nitride layer disposed on a field oxide layer formed using known field oxidation methods, such as the well-known local oxidation of silicon (LOCOS) process. Alternatively, an oxide layer could be grown and then patterned. An opening in dielectric layer 10 permits bonding pad 22 to directly contact substrate 12. Bonding pad 22 may also be formed on a doped polysilicon layer (not shown) having an n-type dopant concentration of, for example, about $10^{20}$ atoms/cm$^3$.

Although the frit glass described above is an insulator, in an alternative embodiment it is possible to use a material for bonding layer 14 that is a conductor. This permits the electrical connection of substrate 12 and cap 16, as described for example, without the need for an additional electrical connection therebetween. It should be noted that metal layer 20 is not needed in this embodiment.

In addition, bonding layer 14 may comprise a combination of insulating and conducting components. It is sufficient in this case that the conducting component of bonding layer 14 provide an adequate electrical connection between substrate 12 and cap 16. By way of example, the conducting material used to form bonding pad 22 may also be patterned to remain over a portion of dielectric layer 10 that is underlying cap 16 in order to provide this conducting component. Thus, electrical contact is made through a conductive portion of bonding layer 14. Again, metal layer 20 is not needed here.

Figure 2:
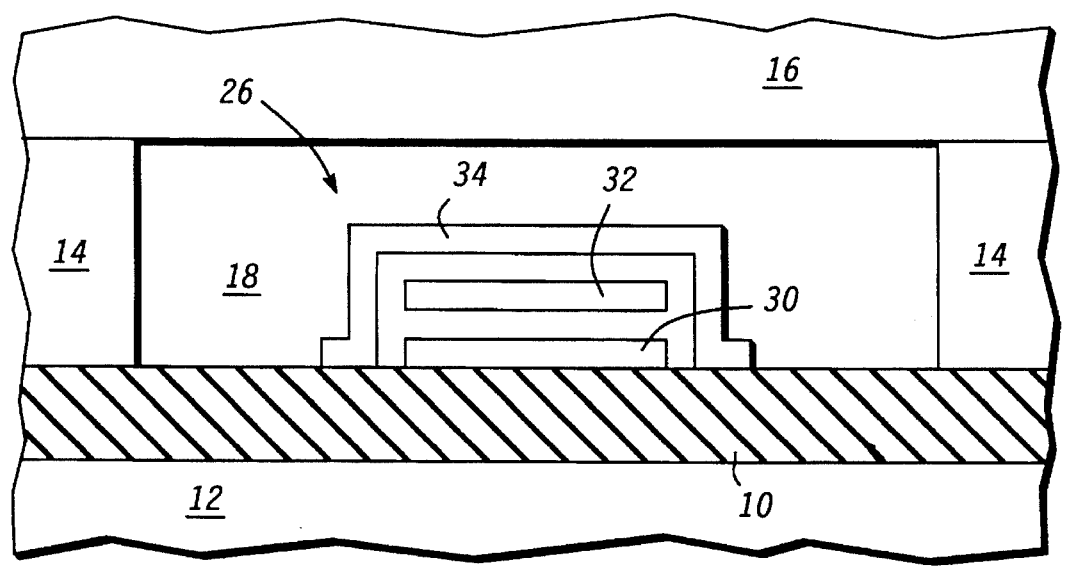
FIG. 2 illustrates an enlarged cross-section of a particular electronic device within the enclosure of FIG. 1.

FIG. 2 illustrates an enlarged cross-section of a specific type of electronic device 26 as positioned within enclosure 8. Prior reference numbers are used for common elements. In the illustrated embodiment electronic device 26 is a capacitive sense accelerometer having a bottom plate 30, a middle plate 32, and a top plate 34. The operation of such an accelerometer is further described by Ristic et al. in "A Capacitive Type Accelerometer with Self-Test Feature Based on a Double-Pinned Polysilicon Structure", cited above and fully incorporated by reference herein. Bottom plate 30 and top plate 34 are supported by substrate 12 and rest on dielectric layer 10. Middle plate 32 is suspended between bottom plate 30 and top plate 34 by tethers (not shown) and is movable in response to external acceleration. Plates 30, 32, and 34 are formed of heavily-doped polysilicon, and a typical pressure in cavity 18 is about 0.05 to 0.1 atm.

As has been discussed above, in the presence of an external acceleration, middle plate 32 moves, resulting in a differential capacitance change, from which the driving acceleration can be determined. This change is sensed by, for example, an amplifier which may be disposed on a separate integrated circuit (not shown) also containing power supply 25. It has been found that the presence of parasitic capacitances from electronic device 26, which is here an accelerometer, to substrate 12 and cap 16 introduces errors into the sensing of this capacitive change. These errors have been found to reduce sensitivity in prior accelerometers by as much as fifty percent. However, according to the present invention, these errors have been substantially eliminated by coupling substrate 12 and cap 16 to power supply 25, as is explained further with reference to FIG. 3 below.

Figure 3:
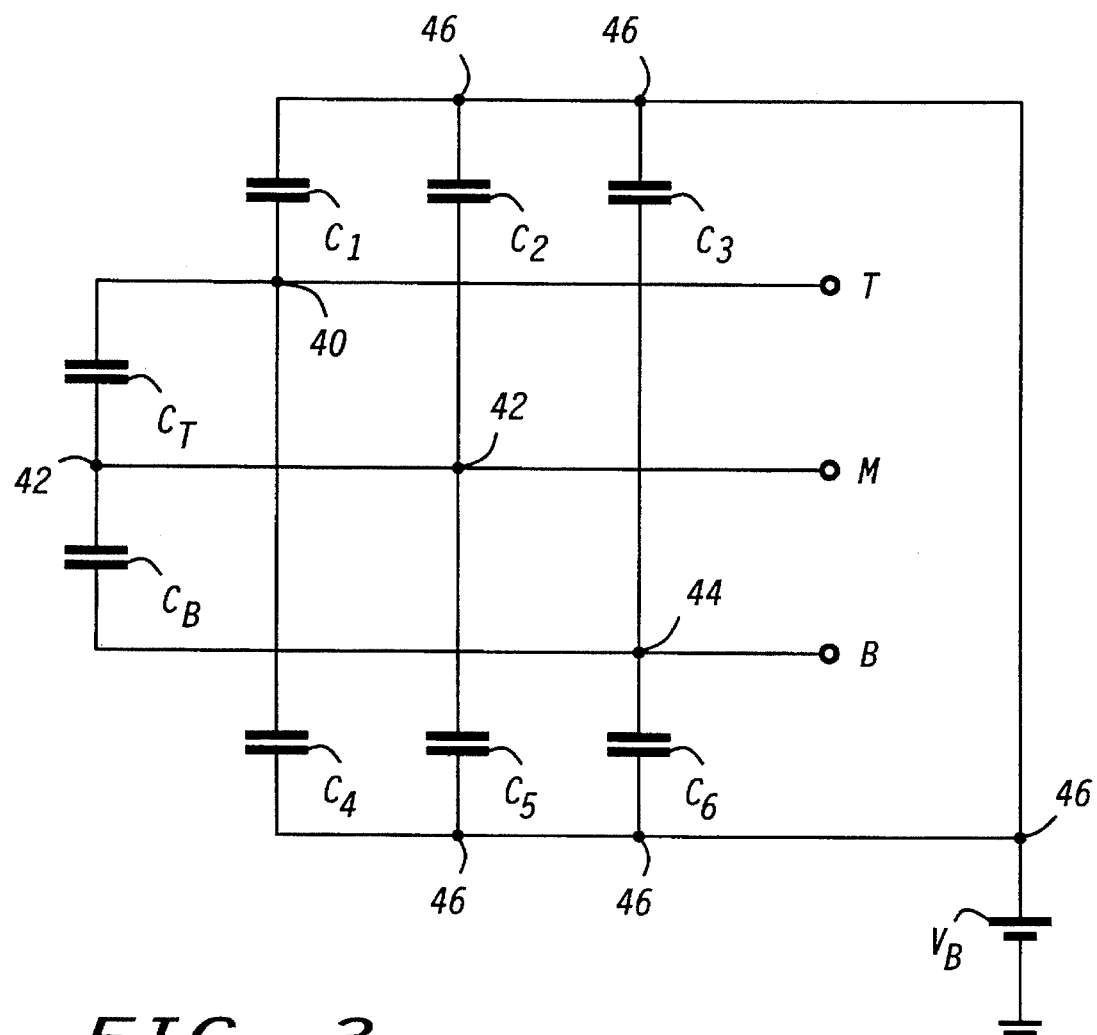
FIG. 3 is a schematic of an equivalent circuit for the electronic device and enclosure of FIGS. 1 and 2 which illustrates the effects of parasitic capacitances on the electronic device.

FIG. 3 is a schematic of an equivalent circuit for enclosure 8 in the specific case where electronic device 26 is an accelerometer. FIG. 3 illustrates the effects of parasitic capacitances on electronic device 26 and corresponds to the preferred embodiment of the invention in which substrate 12 and cap 16 are both connected to first power supply output 27. Capacitor $C_T$ corresponds to the capacitance provided between middle plate 32 and top plate 34, and capacitor $C_B$ corresponds to the capacitance provided between bottom plate 30 and middle plate 32. A typical value for each of capacitors $C_T$ and $C_B$ is about 0.5 pF. Capacitors $C_1$, $C_2$, and $C_3$ correspond to parasitic capacitances between plates 30, 32, and 34 of device 26 and cap 16. Also, capacitors $C_4$, $C_5$, and $C_6$ correspond to parasitic capacitances between plates 30, 32, and 34 of device 26 and substrate 12. Output terminals T, M, and B are used for measuring acceleration and are connected to nodes 40, 42, and 44, respectively. A voltage supply $V_B$ corresponds to power supply 25 and is connected to a node 46.

In typical, ideal operation, positive and negative step voltages of equal magnitude are applied respectively to terminals T and B. Terminal M, which corresponds to middle plate 32, is held at a constant potential during measurement. In the absence of an external acceleration, capacitors $C_T$ and $C_B$ are equal, and a difference current through terminal M is zero. In the presence of an external acceleration, capacitors $C_T$ and $C_B$ are not equal, and a difference current is sensed through terminal M.

In prior accelerometers, the substrate and cap were not connected to a power supply. Because the material typically used to attach the substrate to a supporting leadframe (not shown) was insulating, the substrate and cap were electrically floating. Referring again to FIG. 3, this prior situation corresponds to a case with node 46 disconnected from voltage supply $V_B$. Thus, in prior accelerometers a positive voltage step on terminal T not only causes a desired current through capacitor $C_T$, but also undesired parasitic currents through capacitors $C_1$ and $C_4$. These parasitic currents return to nodes 42 and 44 through capacitors $C_2$, $C_3$, $C_5$, and $C_6$. As one example, a transient current flowing from terminal T through capacitor $C_4$ returns to node 42 via capacitor $C_5$. Similar currents occur due to voltage steps applied to terminal B. Overall, the presence of these parasitic current paths causes significant measurement errors when sensing a difference current through terminal M.

According to the present invention, the above errors have been eliminated by coupling substrate 12 and cap 16 to power supply 25. This is represented in FIG. 3 by the connection of node 46 to voltage supply $V_B$. Voltage supply $V_B$ provides a low impedance path for shunting parasitic transient currents from capacitors $C_1$, $C_2$, $C_3$, $C_4$, $C_5$, and $C_6$. As one example, voltage supply $V_B$ shunts current from capacitor $C_4$ to ground rather than allowing this current to return to terminals M or B through capacitors $C_5$ or $C_6$. Accordingly, the impedance of power supply 25 is made substantially low relative to the impedances represented by capacitors $C_1$, $C_2$, $C_3$, $C_4$, $C_5$, and $C_6$ so that this shunting is effective. By shunting these transient currents, sensing errors due to parasitic capacitances are substantially eliminated and measurement sensitivity is improved.

The magnitude and polarity of the fixed potential provided by first and second power supply outputs 27 and 29 may vary widely. However, in order to minimize electrostatic attraction between middle plate 32, which is movable, both first and second power supply outputs 27 and 29 preferably provide a fixed potential substantially equal to the potential applied to middle plate 32 during acceleration measurements. This minimizes any movement of middle plate 32 due to electrostatic attraction.

Although electronic device 26 has been described with reference to an accelerometer, one of skill in the art will appreciate that other devices may be placed in enclosure 8. For example, device 26 may include transistors, resistors, capacitors, inductors, transducers, surface acoustic wave devices, or combinations thereof. Also, other changes that will be apparent to one of skill in the art may be made to the above embodiments such as the use of other substrate materials. For example, substrate 12 may be gallium arsenide. Also, an access port may be provided to connect electronic device 26 to an outside environment, for example, to sense pressure or the presence of certain chemicals.

By now, it should be appreciated that there has been provided a novel enclosure for an electronic device. The enclosure provides the advantage of reducing the adverse effects of the parasitic capacitances of the supporting substrate and the enclosing cap. The result is significantly improved measurement sensitivity. Another advantage of the present invention is that enclosure 8 acts as an EMI shield for electronic device 26. This is desirable because middle plate 32 otherwise could move in response to external electromagnetic fields. Further advantages are that enclosure 8 provides improved protection against electrostatic discharge and protection against adverse external ambient environments.

We claim:

1. An enclosure for an electronic device comprising:
   a conductive semiconductor substrate underlying said electronic device;
   a dielectric layer on said substrate;
   a conductive cap overlying said electronic device and bonded to said dielectric layer using a bonding layer; and
   a power supply output having a substantially fixed potential, wherein said power supply output is electrically coupled to said conductive semiconductor substrate and to said conductive cap.

2. The enclosure of claim 1 further comprising a metal layer disposed on said conductive cap, wherein said metal layer is electrically connected to said power supply output.

3. The enclosure of claim 1 wherein said electronic device is a capacitive accelerometer having a bottom plate disposed overlying said conductive semiconductor substrate, having a middle plate overlying said bottom plate and movable in response to an acceleration force, and having a top plate overlying said middle plate.

4. The enclosure of claim 3 wherein said substantially fixed potential is substantially equal to a potential applied to said middle plate.

5. The enclosure of claim 3 wherein said bottom plate is directly on said dielectric layer.

6. The enclosure of claim 1 wherein said power supply output is provided by a bandgap regulator power supply.

7. The enclosure of claim 1 wherein:
   said conductive semiconductor substrate has a dopant concentration greater than about $10^{18}$ atoms/cm$^3$; and
   said conductive cap is a semiconductor having a dopant concentration greater than about $10^{18}$ atoms/cm$^3$.

8. The enclosure of claim 1 wherein said bonding layer further provides a hermetically sealed environment for said electronic device.

9. The enclosure of claim 1 wherein said bonding layer has been patterned to provide a cavity and said electronic device is sealed in said cavity.

10. The enclosure of claim 1 wherein:
    said conductive semiconductor substrate is n-type silicon; and
    said conductive cap is n-type silicon.

11. The enclosure of claim 10 wherein said bonding layer has a thickness less than about 50 microns.

12. The enclosure of claim 1 wherein at least a portion of said bonding layer is conductive.

13. The enclosure of claim 1 wherein said bonding layer is an insulating layer.

14. An enclosure for an electronic device comprising:
    a conductive semiconductor substrate underlying said electronic device;
    a conductive cap overlying said electronic device;
    a power supply output having a substantially fixed potential, wherein said power supply output is electrically coupled to said conductive semiconductor substrate and to said conductive cap; and
    a bonding pad disposed on said conductive semiconductor substrate, wherein said bonding pad is electrically connected to said power supply output.

15. The enclosure of claim 14 further comprising a metal layer disposed on said conductive cap, wherein said bonding pad is connected to said metal layer by an electrical conductor.

16. An enclosure for an electronic device comprising:
    a conductive semiconductor substrate underlying said electronic device;
    a dielectric layer on said substrate;
    a conductive cap overlying said electronic device and bonded to said dielectric layer using a bonding layer;
    a first power supply output having a substantially fixed potential, wherein said first power supply output is electrically coupled to said conductive semiconductor substrate; and
    a second power supply output having a substantially fixed potential, wherein said second power supply output is electrically coupled to said conductive cap.

* * * * *